(12) United States Patent
Egnot

(10) Patent No.: US 6,373,333 B2
(45) Date of Patent: Apr. 16, 2002

(54) VITAL "AND" GATE APPARATUS AND METHOD

(75) Inventor: James R. Egnot, Melbourne, FL (US)

(73) Assignee: GE-Harris Railway Electronics, LLC, Melbourne, FL (US)

( * ) Notice: Subject to any disclaimer, the term of this patent is extended or adjusted under 35 U.S.C. 154(b) by 0 days.

(21) Appl. No.: 09/752,107

(22) Filed: Dec. 29, 2000

Related U.S. Application Data

(60) Provisional application No. 60/173,878, filed on Dec. 30, 1999.

(51) Int. Cl.$^7$ .......................... H02M 7/162; G05F 1/10; G05F 3/02
(52) U.S. Cl. .......................... 327/589; 327/20; 327/535
(58) Field of Search .......................... 327/20, 104, 390, 327/530, 535, 536, 538, 540, 547, 589; 326/14

(56) References Cited

U.S. PATENT DOCUMENTS

| | | | |
|---|---|---|---|
| 4,677,316 A | | 6/1987 | Guillaumin |
| 4,786,822 A | | 11/1988 | Steely |
| 5,642,073 A | * | 6/1997 | Manning ..................... 327/536 |
| 5,767,735 A | * | 6/1998 | Javanifard et al. .......... 327/536 |
| 6,026,003 A | * | 2/2000 | Moore et al. ................ 307/110 |
| 6,052,022 A | * | 4/2000 | Lee .............................. 307/110 |
| 6,229,385 B1 | * | 5/2001 | Bell et al. .................... 327/536 |
| 6,275,096 B1 | * | 8/2001 | Hsu et al. .................... 327/534 |

FOREIGN PATENT DOCUMENTS

FR  2 510 845  2/1983

OTHER PUBLICATIONS

International Search Report.

* cited by examiner

Primary Examiner—My-Trang Nu Ton
(74) Attorney, Agent, or Firm—Carl Rowold; Armstrong Teasdale LLP

(57) ABSTRACT

A method for performing an "AND" operation on two independent inputs in a fail-safe manner includes cascading two charge pumps to output a condition signal representing the "AND'ed" state of the inputs. Each independent input has an active state asserted by a waveform of predetermined frequency and duty cycle, and an inactive fail-safe state asserted by a zero voltage. The method includes supplying power to a first charge pump, supplying power from the first charge pump to a second charge pump, and supplying each of the independent inputs to one of the respective charge pumps. A condition signal is output using an output from the second charge pump. Additionally, the method verifies the correctness of the frequency and duty cycle of each independent input using a cross connection scheme. This method provides a high-power, low-loss, and low-cost electrical circuit for operating devices responding to specific voltages, for example, vital relays.

34 Claims, 3 Drawing Sheets

VITAL "AND" GATE APPARATUS AND METHOD

CROSS REFERENCE TO RELATED APPLICATIONS

This application claims the benefit of U.S. provisional application Ser. No. 60/173,878, filed Dec. 30, 1999.

BACKGROUND OF THE INVENTION

This invention relates generally to electrical circuit components and, more specifically, to vital "AND" gates.

As generally understood in the art, a vital component of a system is one configured to fail-safe under credible failure conditions. For example, a vital relay in a control system operating under the closed circuit principle is normally held energized with its front contacts closed. In a fail-safe condition, if a vital relay fails, the front contacts open. Failure, then, of a vital circuit that drives a vital relay de-energizes the relay, resulting in the front contacts of the relay opening. Logic elements such as "AND" gates often are required to be vital. Any failure of a vital "AND" gate must not result in a permissive, e.g. "on", output by the gate.

It is known to use charge pump circuits for driving vital biased-neutral devices, such as relays. Charge pumps are utilized to develop a DC voltage from a pulse train input signal. In a charge pump circuit, input and output voltages can be of opposite polarity. Although known vital electronic circuits that include vital "AND" gates generally provide acceptable operational characteristics, they typically include inductive components that are heavy, bulky and expensive. It is also known for high power charge pumps to perform switching using transistors, for example, bipolar transistors along with complicated drive circuitry. Charge pump efficiency is increased if such semiconductor switches have low loss. MOSFPTs have low loss, but when arranged in a charge pump totem pole configuration, exhibit undesirable cross conduction or "shoot through". To minimize shoot-through time, switching often is performed at high frequencies which are not optimal for some applications.

BRIEF SUMMARY OF THE INVENTION

In one embodiment, a method for performing an "AND" operation on two independent vital inputs in a fail-safe manner includes cascading two charge pumps to output a condition signal representing the combined, or AND'ed, state of the vital input devices. Each independent input has an active, or less restrictive, state asserted by a waveform of predetermined frequency and duty cycle. Each independent input also has an inactive, or fail-safe, state asserted by a zero voltage. The method includes supplying power to a first charge pump, supplying power from the output of the first charge pump to a second charge pump, and supplying each of the independent inputs to one of the respective charge pumps. A condition signal is achieved using an output from the second charge pump. More specifically, a DC voltage of a first polarity is asserted to place the output in an active state, or, alternatively, a zero voltage is asserted to place the output in an inactive state. Under certain failure conditions, such as a DC voltage of a second and opposite polarity being output from the second charge pump, a biased neutral device being driven must safely tolerate the failure condition.

Each charge pump receives an independent input signal, e.g. a square waveform generated by one of two independent microcontrollers, or any independently vital means, and the second charge pump output drives a vital biased-neutral device, such as a relay. More specifically, the second charge pump drives the biased-neutral relay only if an independent square waveform is present at the input to each charge pump. One square waveform drives the first charge pump which supplies electrical energy to the second charge pump. The square waveform supplied to the second charge pump generates a voltage that drives the output device. Failure of any charge pump component results in either zero voltage to the output device, or a voltage of polarity opposite to a voltage polarity to which the output device responds. Either condition is considered a fail-safe state.

In another embodiment, the first and second charge pumps are implemented using MOSFET switching components in totem pole configurations. Only one MOSFET at a time is switched on in the charge pump totem pole configuration.

The above-described "AND" gate and method provide a high-power, low-loss, and low-cost electrical circuit for operating vital devices responding to specific voltages, for example, vital relays. Because only one MOSFET in each totem pole is on at a time, MOSFET current shoot-through is avoided.

DETAILED DESCRIPTION OF THE INVENTION

Generally, vital "AND" gates including cascaded charge pumps are described herein. The present invention, however, is not limited to the specific exemplary embodiments described herein.

Figure 1:
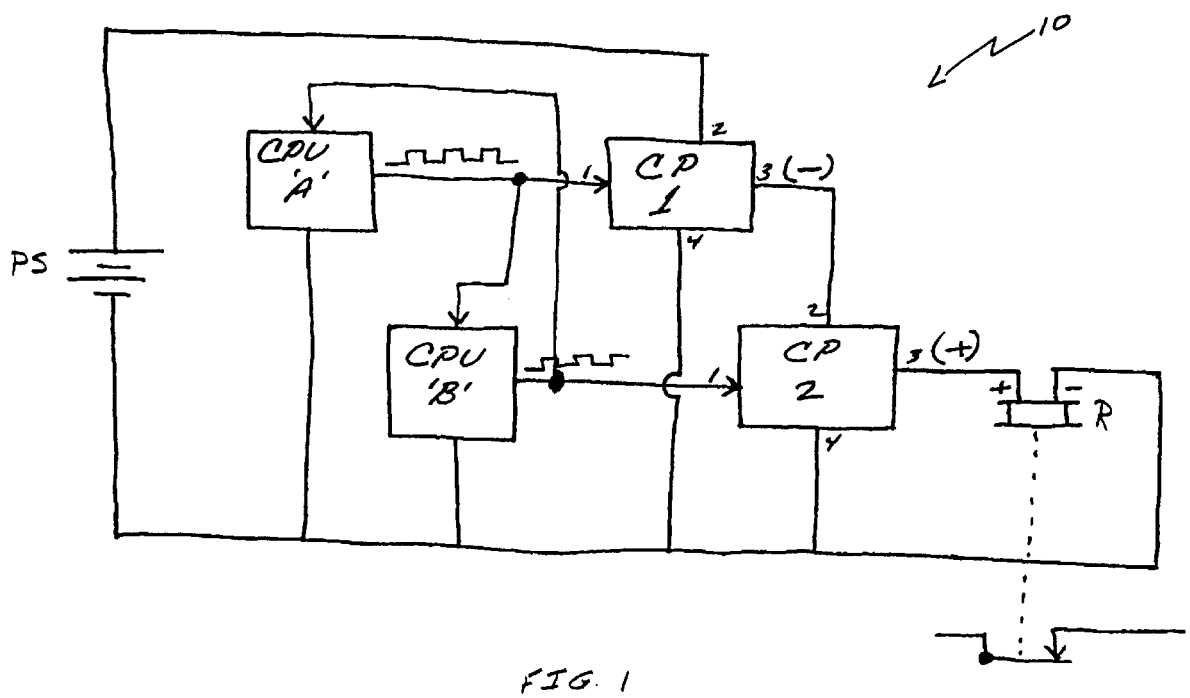
FIG. 1 is a block diagram of an "AND" gate including charge pumps in accordance with one embodiment of the present invention.

Referring now specifically to the drawings, FIG. 1 is a block diagram of a vital "AND" gate 10 including charge pumps CP1 and CP2 in accordance with one embodiment of the present invention. Input signals to charge pumps CP1 and CP2 are independent, i.e. generated independently, for example, by microcontrollers A and B. Microcontroller A supplies an independent input 16 to charge pump CP1 and microcontroller B supplies an independent input 18 to charge pump CP2. Charge pumps CP1 and CP2 are cascaded. More specifically, an output 30 of charge pump CP1 is utilized to supply power to charge pump CP2. A power supply PS is configured to energize charge pump CP1 via an input 32. An output 40 of charge pump CP2 is supplied to a biased-neutral relay R. Of course, charge pumps CP1 and CP2 could be used in connection with any device that responds only to a predetermined voltage polarity, and biased-neutral relay R is one exemplary application.

Each of independent inputs 16 and 18 to vital "AND" gate 10 has an active state asserted by a waveform of predetermined frequency and duty cycle. For example, microcontrollers A and B each generate square waveforms having fifty-percent duty cycles. Signals input to charge pumps CP1 and CP2 may have different frequencies and duty cycles, depending on the overall configuration of vital "AND" gate 10 and specifications of any device to be driven by vital "AND" gate 10. Each independent input to vital "AND" gate 10 also has inactive and fail-safe states asserted by a zero voltage.

In operation, and in one embodiment, charge pump CP2 drives biased-neutral relay R only if: (a) microcontroller A, independently of microcontroller B, generates a waveform input 16 having a frequency and duty cycle predetermined as exhibiting an active state, (b) microcontroller B, independently of microcontroller A, generates a waveform input 18 also having a frequency and duty cycle predetermined as exhibiting an active state, and (c) each of charge pumps CP1 and CP2 is energized and operating normally. If either or both inputs 16 and 18 exhibit an inactive (also fail-safe) state as described above, or if any components of charge pumps CP1 and CP2 fail, one of only two possible outcomes results: either a zero voltage at an output 40 of charge pump CP2, or a voltage of polarity opposite to a voltage polarity to which relay R is configured to respond. Both results are fail-safe conditions.

As described above the square waveform from microcontroller A is supplied to microcontroller B, and the square waveform from microcontroller B is supplied to microcontroller A. Microcontroller A and microcontroller B check the frequency and duty cycle of the waveform output by the other microcontroller. The microcontrollers may or may not be performing other vital and/or non-vital missions. The square waveforms output by the microcontrollers typically have specific diverse frequencies and operate generally with a 50% duty cycle. If the frequency or duty cycle of either waveform is in error or out of tolerance, the microcontroller that detects the error stops generating its square waveform output. If both waveforms are not in error and within tolerance, then microcontroller A and B continue to generate independent square waveform outputs. By programming the microcontrollers to perform the frequency and duty cycle checks, a need for physical filters for the two pulse trains is eliminated.

Figure 2:
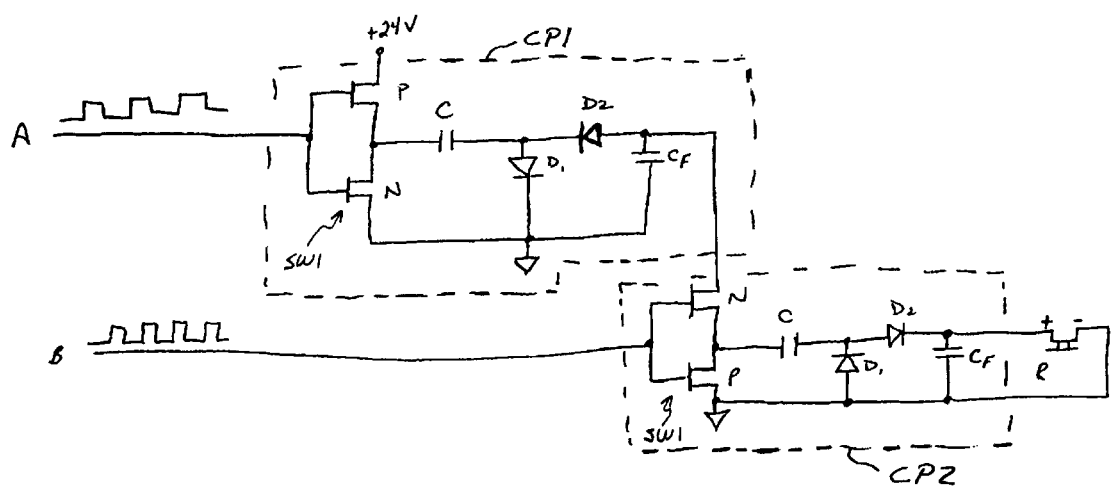
FIG. 2 is a circuit schematic diagram of one embodiment of the charge pumps illustrated in FIG. 1.

Charge pump CP1 receives the square waveform output from microcontroller A, and charge pump CP2 receives the square waveform output from microcontroller B. Each of charge pumps CP1 and CP2 is a voltage inverting circuit such that DC output voltage from each of charge pumps CP1 and CP2 has a polarity opposite to a polarity of its input voltage. Accordingly and as shown in FIG. 2, during normal operation, for example, charge pump CP1 outputs a DC signal having a negative polarity and charge pump CP2 outputs a DC signal having a positive polarity. Thus independent input 16 is used to drive charge pump CP1 to generate a supply voltage to charge pump CP2, and independent input 18 is used to generate a driving voltage to biased-neutral relay R, thereby achieving the function of ANDing the two inputs.

When the square waveforms output by microcontroller A and microcontroller B are acceptable, and all, other circuit components are operating properly, CP 2 generates a positive DC voltage signal to energize, or activate, relay R. If microcontroller A detects an error in the square waveform signal output by microcontroller B, then microcontroller A immediately interrupts its generation of an output square waveform. As a result, CP 1 is biased to generate a DC voltage which is of the opposite polarity required to energize relay R, i.e., a fail safe condition. Likewise, if microcontroller B detects an error in the square waveform signal output by microcontroller A, then microcontroller B immediately interrupts its generation of an output square waveform. As a result, CP 2 does not generate a DC voltage signal and no signal is supplied to relay R, i.e., a fail safe condition.

Referring to FIG. 2, each of charge pumps CP1 and CP2 includes a switch SW1, a charge capacitor C, a filter capacitor $C_F$ and control diodes D1 and D2. Power source PS supplies a biasing voltage of, for example, +24 volts to switch SW1 of charge pump CP1 via input 32. A voltage is supplied to switch SW1 of charge pump CP2 from output 30 of CP1.

Charge pump CP2 drives vital relay R by asserting a voltage configured to place relay R in either an active or an inactive state, dependent on the voltage polarity. More specifically, provided that all other "AND" gate 10 components are operating normally, charge pump CP2 generates a positive DC voltage signal to energize, or activate, relay R. If the square waveform signal from microcontroller B is halted or interrupted, then, as a result, a fail-safe condition occurs, i.e. charge pump CP2 does not generate a DC voltage signal and thus a zero voltage signal is supplied to relay R. Thus an "AND" operation is performed on the two input signals, resulting in an output condition signal supplied by charge pump CP2 to relay R.

Figure 3:
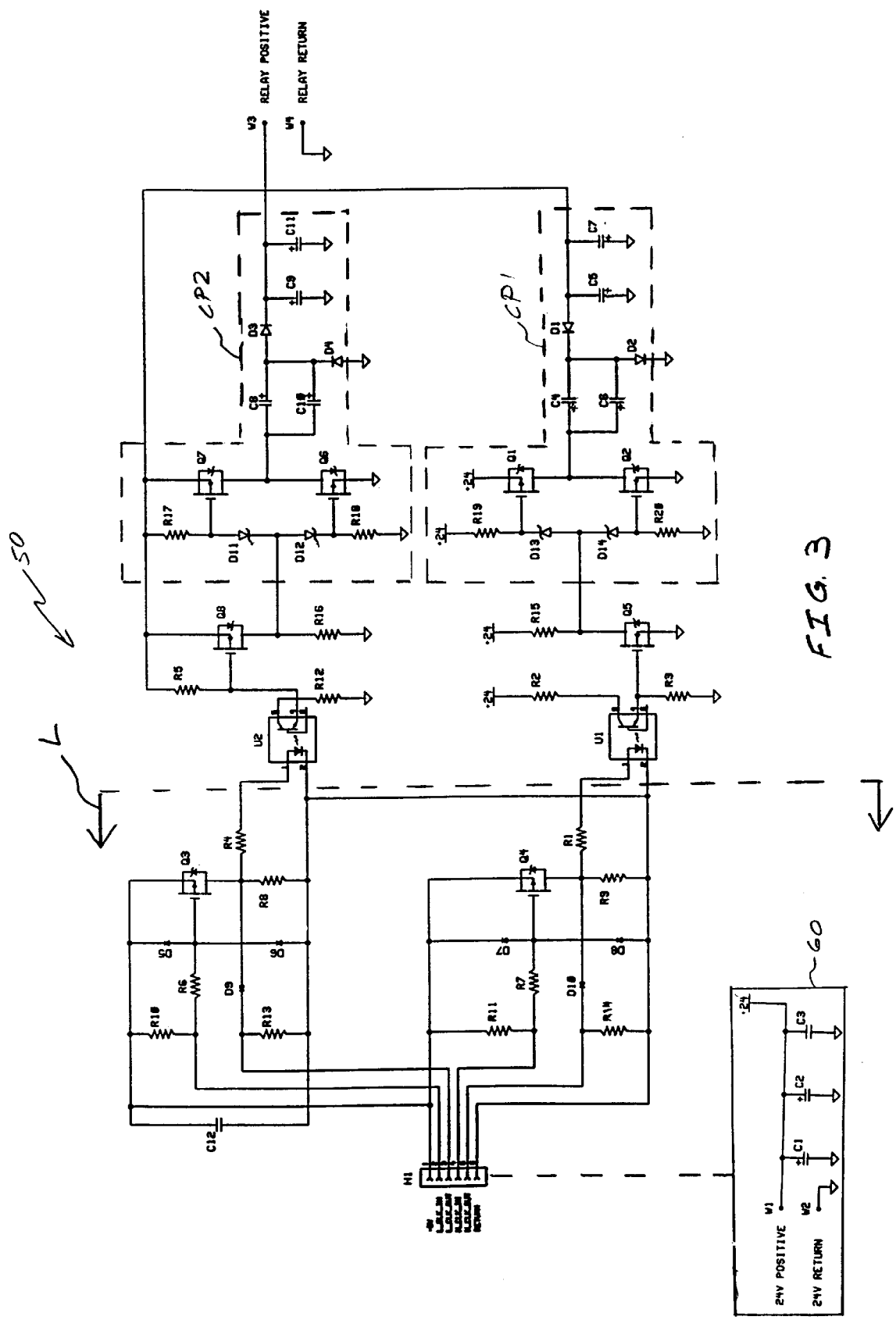
FIG. 3 is a circuit schematic diagram of the "AND" gate shown in FIG. 1 along with a circuit that supplies voltage signals to the charge pumps.

FIG. 3. is a circuit schematic diagram of "AND" gate 10 including charge pumps CP1 and CP2 as shown in FIG. 2. "AND" gate 10 is connected to a circuit 50 that supplies voltage signals from, e.g., microcontrollers A and B to charge pumps CP1 and CP2. A circuit 60 supplies a biasing voltage of, for example, +24 volts to circuit 50. In the exemplary embodiment illustrated in FIG. 3, the following values are used.

| Resistors | | Capacitors | | Diodes | |
|---|---|---|---|---|---|
| R1 | 475 | C1 | 220 uF | D1 | SR306 |
| R2 | 4.99K | C2 | 220 uF | D2 | SR306 |
| R3 | 4.99K | C3 | 0.1 uF | D3 | SR306 |
| R4 | 475 | C4 | 220 uF | D4 | SR306 |
| R5 | 4.99K | C5 | 220 uF | D5 | 1N4148 |
| R6 | 475 | C6 | 220 uF | D6 | 1N4148 |
| R7 | 475 | C7 | 220 uF | D7 | 1N4148 |
| R8 | 4.99K | C8 | 220 uF | D8 | 1N4148 |
| R9 | 4.99K | C9 | 220 uF | D9 | 1N4148 |
| R10 | 4.99K | C10 | 220 uF | D10 | 1N4148 |
| R11 | 4.99K | C11 | 220 uF | D11 | 1N5245A |
| R12 | 4.99K | C12 | 0.1 uF | D12 | 1N5245A |
| R13 | 4.99K | | | D13 | 1N5245A |
| R14 | 4.99K | | | D14 | 1N5245A |
| R15 | 470 | | | | |
| R16 | 470 | | | | |
| R17 | 2.21K | | | | |
| Resistors | | | | | |
| R18 | 2.21K | | | | |
| R19 | 2.21K | | | | |
| R20 | 2.21K | | | | |

| MOSFETS | | Optoisolators | |
|---|---|---|---|
| Q1 | 1RF9530 | U1 | CNY17-3 |
| Q2 | 1RF530 | U2 | CNY17-3 |
| Q3 | BS250 | | |
| Q4 | BS250 | | |
| Q5 | BS170 | | |
| Q6 | 1RF9530 | | |
| Q7 | 1RF530 | | |
| Q8 | BS170 | | |

In FIG. 3, charge pumps CP1 and CP2 correspond to charge pumps CP1 and CP2 as shown in FIGS. 1 and 2. Each of transistor pairs Q1, Q2 and Q6, Q7 is configured in a totem pole configuration. Capacitors C5; C7, C9, and C11 function as charge storage devices. A circuit board (not shown) containing microcontrollers A and B is connected to connector H1. Microcontroller A interfaces with charge pump CP1, and microcontroller B interfaces with charge pump CP2, via circuit 50 components.

In one embodiment, components included in systems 10, 50 and 60 are mounted on one circuit board. In an alternative embodiment, components included in systems 10, 50 and 60 are distributed on multiple circuit boards depending on efficient utilization of board space and heat dissipation, as is known in the art. In a further alternative embodiment, interface circuitry 50 is replaced by an alternative form of interface circuitry. In a still further alternative embodiment, input signals are supplied by sources other than microcontrollers A and B. As described above, such inputs are independently generated, each having an active state asserted by a waveform of predetermined frequency and duty cycle. Each such input also has inactive and fail-safe states asserted by a zero voltage.

In operation, output signals are supplied by, e.g., microprocessors A and B to interface circuitry 50 to drive or enable outputs of optoisolators U1 and U2. Optoisolator U1 is configured so that a positive voltage from microcontroller A enables an output of optoisolator U1. A series of pulses continuously applied to optoisolator U1 results in, e.g., a −24-volt output 62 of capacitor C7. More specifically, the pulses output from optoisolator U1 result in a switching on and off of MOSFET Q5 so that, for example, a 0 to +24-volt square wave is supplied to a junction 64 of diodes D13 and D14. When voltage at junction 64 is approximately zero, MOSFET Q1 is switched on (i.e. a gate current flows to MOSFET Q1) and MOSFET Q2 is switched off (i.e. virtually no gate current flows to MOSFET Q2). As voltage at junction 64 increases and approaches a defined dead band voltage range as described below, MOSFET Q1 switches off (i.e. the gate current to MOSFET Q1 shuts off) and MOSFET Q2 remains off. When voltage at junction 64 exceeds a breakdown voltage of diode D14, MOSFET Q2 switches on (i.e. a gate current flows to MOSFET Q2) and MOSFET Q1 remains off. A first pulse charges capacitors C4 and C6 to approximately −24 volts. A second pulse charges capacitors C5 and C7 so that approximately −24 volts are transmitted to resistors R5 and R17 and MOSFETS Q7 and Q8.

Values of zener diodes D13 and D14 are selected to create a dead band so that, as output voltage of MOSFET Q5 transitions from a high level to a low level and from a low level to a high level, both MOSFETS Q1 and Q2 are switched off, i.e. no gate current flows to either MOSFET Q1 or Q2. This dead band prevents shoot through of current through MOSFETS Q1 and Q2, since no more than one of MOSFETs Q1 and Q2 is switched on at any time.

Similarly, optoisolator U2 is configured so that a positive voltage from microcontroller B enables an output of optoisolator U2, but each voltage is opposite in polarity so that an output of +24 volts is produced from capacitor C11. Voltage at junction 66 of D11 and D12 ranges from zero volts to −24 volts. It is assumed that when a negative voltage, e.g. −24 volts, is produced from capacitor C11, the voltage results from normal operation of optoisolator U1 and related circuitry and not from a failure mode. Additionally, in order to generate a false positive output, at least three consecutive components would be required to fail simultaneously. For example, to produce +24 volts at input 40 to relay R, MOSFET Q7, diode D3, and capacitor C8 or C10 would each be required to fail simultaneously in a remote failure mode. Particularly, each such component would have to short.

Several components of charge pump circuit 10 as shown in FIG. 3 are redundant to enhance reliability of circuit 10.

In an alternative embodiment, pairs of capacitors such as capacitors C5 and C7, capacitors C4 and C6, capacitors C9 and C11, and capacitors C8 and C10, are replaced with single capacitors.

If relay R inputs are removed, i.e., at least one of charge pumps CP1 and CP2 fails, relay R is turned off in approximately 1 second as a result of a time constant defined by capacitor C9 (440 uF) and a relay impedance of 500 ohms, i.e., when DC current through relay R drops below a holding current, relay R drops out or opens. Charge pump circuit 10 operates at a frequency of less than 200 hertz in one embodiment.

Figure 4:
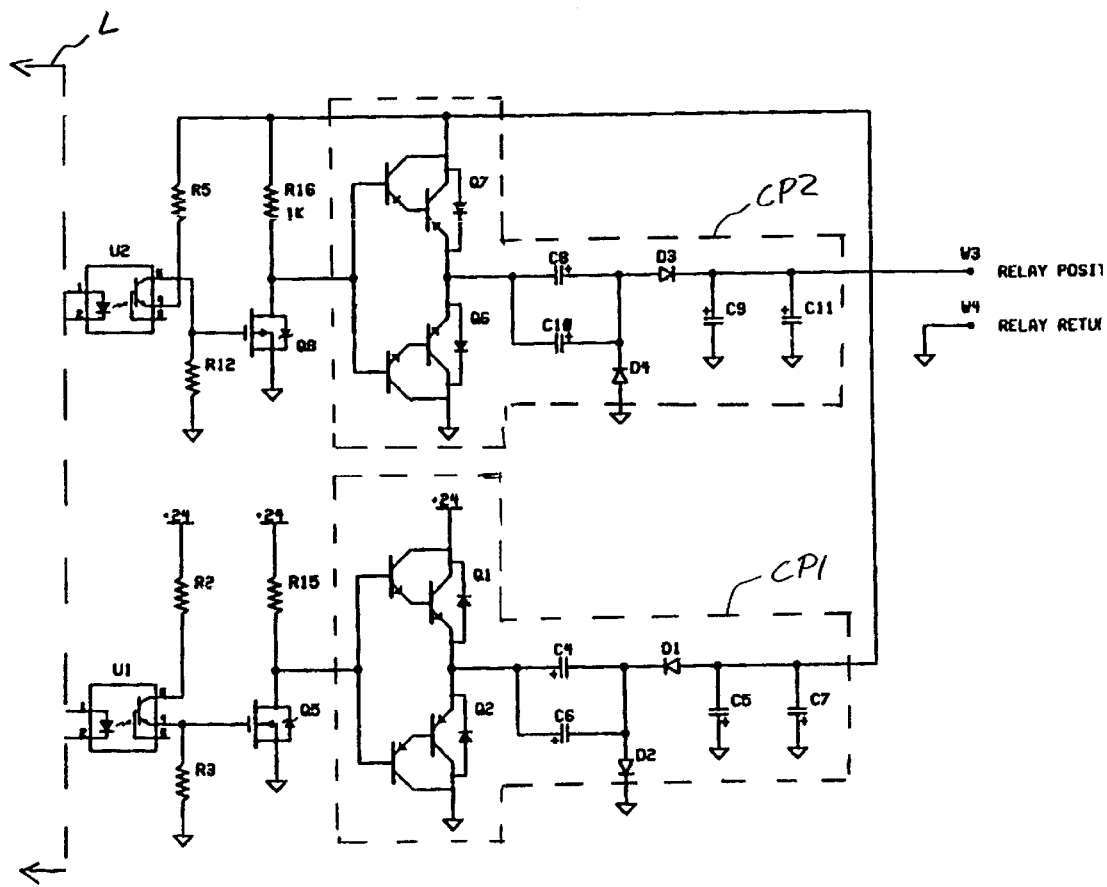
FIG. 4 is a circuit schematic diagram of an alternative embodiment of an "AND" gate.

FIG. 4 is a circuit schematic diagram of a charge pump circuit 70, an alternative embodiment of the present invention. In circuit 70, Darlington pairs Q1, Q2 and Q6, Q7 are utilized rather than MOSFETS. Other embodiments of circuits implementing the above described vital "AND" gate also are possible. In the exemplary embodiment shown in FIG. 4, the following component values are used.

| Optoisolators | | Capacitors | | | |
|---|---|---|---|---|---|
| U1 | CNY17-3 | C1 | 470 uF | C7 | 470 uF |
| U2 | CNY17-3 | C2 | 470 uF | C8 | 220 uF |
| | | C4 | 470 uF | C9 | 220 uF |
| | | C5 | 470 uF | C10 | 220 uF |
| | | C6 | 470 uF | C11 | 220 uF |

| Resistors | | Transistors | | Diodes | |
|---|---|---|---|---|---|
| R2 | 4.99K | Q1 | 2N6045 | D1 | SR306 |
| R3 | 4.99K | Q2 | 2N6042 | D2 | SR306 |
| R5 | 4.99K | Q5 | BS170 | D3 | SR306 |
| R12 | 4.99K | Q6 | 2N6045 | D4 | SR306 |
| R15 | 1K | Q7 | 2N6042 | | |
| R16 | 1K | Q8 | BS250 | | |

The above described charge pump circuit is configured without inductors and makes use of low-loss transistors to provide high power efficiently without cross-conduction. Since cross-conduction is eliminated, the above-described charge pumps can be operated at reduced frequencies, for example, at less than two hundred hertz. The above-described circuit also provides for performance of a vital "AND" operation on two inputs and thus provides for fail-safe operation of such devices as vital relays.

While the invention has been described in terms of various specific embodiments, those skilled in the art will recognize that the invention can be practiced with modification within the spirit and scope of the claims.

What is claimed is:

1. A method for performing an "AND" operation on a first independent input and a second independent input in a fail-safe manner, each independent input having an active state asserted by a waveform of predetermined frequency and duty cycle, each independent input having inactive and fail-safe states asserted by a zero voltage, said method comprising the steps of:

supplying power to a first charge pump;

supplying power from the first charge pump to a second charge pump;

supplying the first independent input to one of the charge pumps and supplying the second independent input to the other of the charge pumps; and outputting a condition signal using an output from the second charge pump.

2. A method in accordance with claim 1 wherein the step of outputting a condition signal using an output from the second charge pump comprises the steps of:

asserting a voltage having a polarity configured to place a vital device in an active state when the device is insensitive to voltage assertions of the opposite polarity; and asserting no voltage to place the vital device in an inactive state.

3. A method in accordance with claim 1 further comprising the steps of:

using the independent input supplied to the first charge pump to generate a supply voltage to the second charge pump; and using the independent input supplied to the second charge pump to generate a driving voltage to a vital device.

4. A method in accordance with claim 3 further comprising the step of generating a driving voltage to a vital device responding to a particular voltage polarity.

5. A method in accordance with claim 4 wherein the vital device is a biased-neutral device.

6. A method in accordance with claim 3 wherein the active state waveform of one of the independent inputs is a square wave having a specific duty cycle.

7. A method in accordance with claim 3 further comprising the step of generating the supply voltage to the second charge pump and the driving voltage to the vital device using at least one switch including transistors in a totem pole configuration.

8. A method in accordance with claim 7 wherein the transistors include MOSFETs.

9. A method in accordance with claim 7 further comprising the step of using at least one switch including Darlington pairs.

10. A method in accordance with claim 7 further comprising the step of configuring at least one of the charge pumps so that no more than one of the transistors in a totem pole configuration is switched on at any time.

11. A method in accordance with claim 1 wherein the step of supplying the first independent input to one of the charge pumps and supplying the second independent input to the other of the charge pumps comprises configuring the charge pumps without using inductors.

12. A method in accordance with claim 1 wherein a first circuit generates the first independent input and a second circuit generates the second independent input, each independent input generated having a predetermined frequency and duty cycle, said method further comprising the steps of:

verifying the frequency and duty cycle of the first independent input using the second circuit; and verifying the frequency and duty cycle of the second independent input using the first circuit.

13. A method in accordance with claim 12 further comprising the steps of:

ceasing to produce the first independent input if the first circuit detects an incorrect frequency for the second input;

ceasing to produce the first independent input if the first circuit detects an incorrect duty cycle for the second input; and ceasing to produce the first independent input if the first circuit detects an incorrect frequency and duty cycle for the second input.

14. A method in accordance with claim 12 further comprising the steps of:

ceasing to produce the second independent input if the second circuit detects an incorrect frequency for the first input;

ceasing to produce the second independent input if the second circuit detects an incorrect duty cycle for the first input; and ceasing to produce the second independent input if the second circuit detects an incorrect frequency and duty cycle for the first input.

15. A vital "AND" gate for two independent inputs, each independent input having an active state asserted by a waveform of predetermined frequency and duty cycle, each independent input having an inactive state and a fail-safe state, the inactive and failsafe states each asserted by a zero voltage, said "AND" gate comprising:

a first charge pump configured to receive one of the independent inputs; and a second charge pump powered by said first charge pump and configured to receive the other of the-independent inputs, said second charge pump having-an-acti-ve-state voltage and polarity output.

16. A vital "AND" gate in accordance with claim 15 wherein each of said charge pumps further comprises a switch, each of said charge pumps further configured to output a voltage using an output from said switch.

17. A vital "AND" gate in accordance with claim 16 wherein each of said charge pumps further configured to output a DC voltage.

18. A vital "AND" gate in accordance with claim 16 wherein said switches further comprise transistors.

19. A vital "AND" gate in accordance with claim 18 wherein said transistors further comprise MOSFETs.

20. A vital "AND" gate in accordance with claim 18 wherein one of said switches further comprises a transistor totem-pole configuration.

21. A vital "AND" gate in accordance with claim 20 wherein said switch configured such that only one of said transistors in said totem-pole configuration is switched on at any time.

22. A vital "AND" gate in accordance with claim 16 wherein said switch further comprises at least one Darlington pair.

23. A vital "AND" gate in accordance with claim 15 wherein said second charge pump configured to drive a vital device.

24. A vital "AND" gate in accordance with claim 23 wherein said second charge pump further configured to drive a biased-neutral relay.

25. A vital "AND" gate in accordance with claim 15 further comprising a power supply connected to said first charge pump.

26. A vital "AND" gate in accordance with claim 15 further configured, upon a failure of any component of said gate, to output a condition signal resulting in a fail-safe state.

27. A vital "AND" gate in accordance with claim 15 wherein a first circuit generates the first independent input and a second circuit generates the second independent input, each independent input generated having a predetermined frequency and duty cycle, the first circuit configured to verify the frequency and duty cycle of the second independent input.

28. A vital "AND" gate in accordance with claim 27 wherein the second circuit configured to verify the frequency and duty cycle of the first independent input.

29. A vital "AND" gate in accordance with claim 28 wherein the second circuit further configured to cease producing the second independent input if the second circuit detects an incorrect frequency for the first input.

30. A vital "AND" gate in accordance with claim 28 wherein the second circuit further configured to cease producing the second independent input if the second circuit detects an incorrect duty cycle for the first input.

31. A vital "AND" gate in accordance with claim 28 wherein the second circuit further configured to cease producing the second independent input if the second circuit detects an incorrect frequency and duty cycle for the first input.

32. A vital "AND" gate in accordance with claim 27 wherein the first circuit further configured to cease producing the first independent input if the first circuit detects an incorrect frequency for the second input.

33. A vital "AND" gate in accordance with claim 27 wherein the first circuit further configured to cease producing the first independent input if the first circuit detects an incorrect duty cycle for the second input.

34. A vital "AND" gate in accordance with claim 27 wherein the first circuit further configured to cease producing the first independent input if the first circuit detects an incorrect frequency and duty cycle for the second input.

* * * * *

UNITED STATES PATENT AND TRADEMARK OFFICE
CERTIFICATE OF CORRECTION

PATENT NO. : 6,373,333 B2  Page 1 of 1
DATED : April 16, 2002
INVENTOR(S) : James R. Egnot It is certified that error appears in the above-identified patent and that said Letters Patent is hereby corrected as shown below:

<u>Column 8,</u>
Line 13, delete "the-independent" insert therefor -- the independent --.
Line 14, delete "having-an-acti-ve-state" and insert therefor -- having an active-state --.

Signed and Sealed this

Twenty-seventh Day of April, 2004

JON W. DUDAS
*Acting Director of the United States Patent and Trademark Office*